United States Patent
Zimmerman

(10) Patent No.: US 11,795,566 B2
(45) Date of Patent: Oct. 24, 2023

(54) PADDLE CHAMBER WITH ANTI-SPLASHING BAFFLES

(71) Applicant: Applied Materials, Inc., Santa Clara, CA (US)

(72) Inventor: Nolan L. Zimmerman, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/071,806

(22) Filed: Oct. 15, 2020

(65) Prior Publication Data

US 2022/0119979 A1 Apr. 21, 2022

(51) Int. Cl.
C25D 17/02 (2006.01)
C25D 21/10 (2006.01)
H01L 21/288 (2006.01)

(52) U.S. Cl.
CPC ............. *C25D 17/02* (2013.01); *C25D 21/10* (2013.01); *H01L 21/2885* (2013.01)

(58) Field of Classification Search
None
See application file for complete search history.

(56) References Cited

U.S. PATENT DOCUMENTS

| 2004/0065540 A1* | 4/2004 | Mayer ............... H01L 21/32134 257/E21.309 |
| 2007/0144912 A1* | 6/2007 | Woodruff ............. C25D 17/001 205/148 |
| 2012/0142196 A1* | 6/2012 | Rye .................... H01L 21/68792 438/758 |
| 2013/0075265 A1* | 3/2013 | McHugh ................ C25D 17/10 205/640 |
| 2013/0086787 A1 | 4/2013 | Puch |
| 2018/0057955 A1 | 3/2018 | He et al. |
| 2019/0301049 A1 | 10/2019 | Zimmerman et al. |

FOREIGN PATENT DOCUMENTS

| CN | 209974955 U | 1/2020 |
| CN | 210916307 U | 7/2020 |
| WO | 2019-040111 A1 | 2/2019 |

OTHER PUBLICATIONS

English translation CN210916307, 2019. (Year: 2019).*
English translation CN209974955, 2019. (Year: 2019).*
English translation KR 20160003111, Sep. 19, 2016 (Year: 2016).*
International Search Report and Written Opinion dated Jan. 21, 2022 in International Patent Application No. PCT/US2021/053584, 10 pages.

* cited by examiner

*Primary Examiner* — Stefanie S Wittenberg
(74) *Attorney, Agent, or Firm* — Kilpatrick Townsend & Stockton LLP

(57) ABSTRACT

Electroplating systems according to embodiments of the present technology may include a plating chamber configured to deposit metal material onto substrates positioned in the plating chamber. The plating chamber may include a rotor and a vessel. The electroplating systems may include at least one of baffle positioned in the plating chamber. The at least one baffle may define a plurality of slots. The at least one baffle may be configured to limit or prevent fluid from splashing the rotor or the plating chamber during operation of the plating chamber.

17 Claims, 8 Drawing Sheets

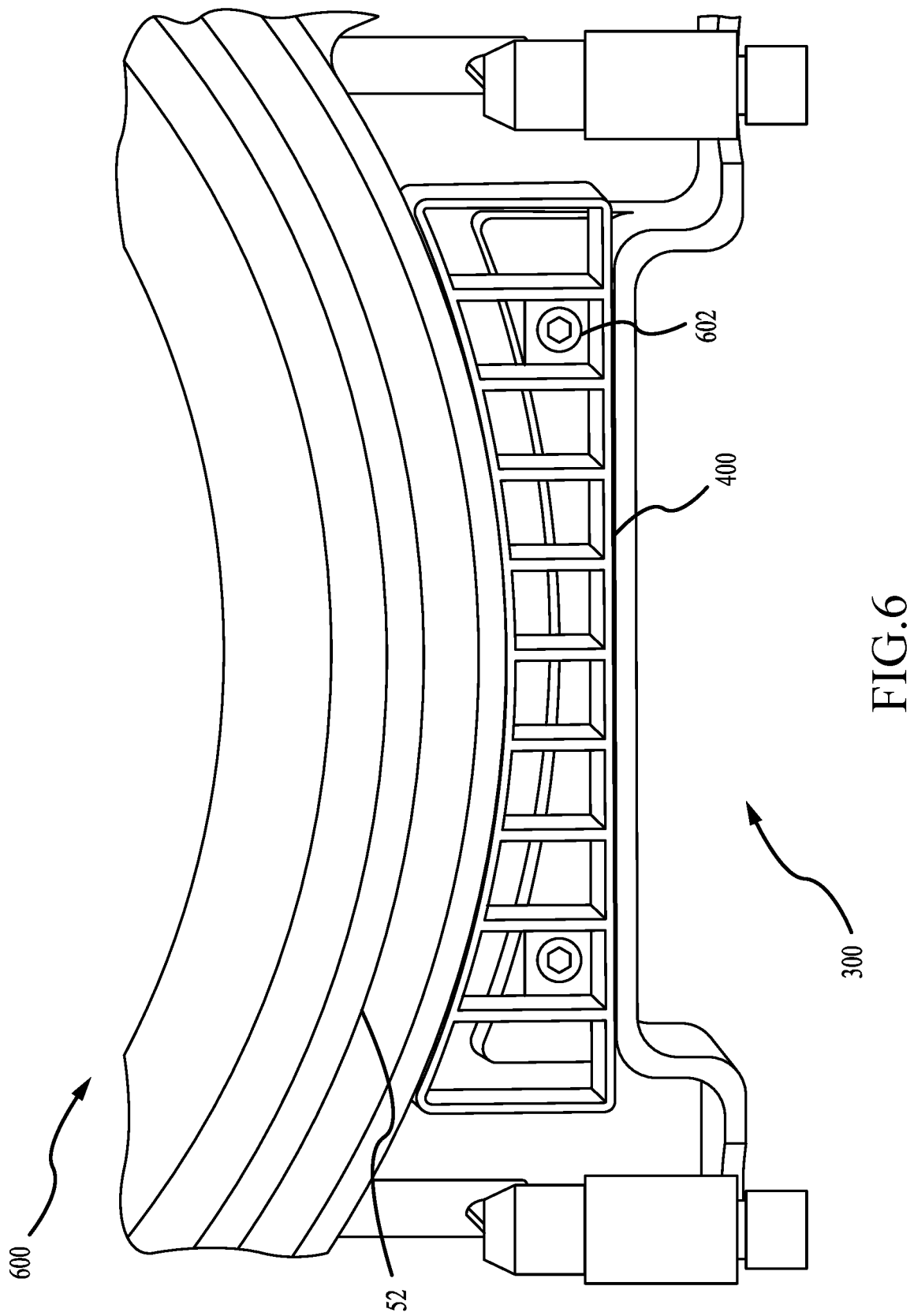

PADDLE CHAMBER WITH ANTI-SPLASHING BAFFLES

TECHNICAL FIELD

The present technology relates to components and apparatuses for semiconductor manufacturing. More specifically, the present technology relates to processing chamber components and other semiconductor processing equipment.

BACKGROUND

Integrated circuits are made possible by processes which produce intricately patterned material layers on substrate surfaces. After formation, etching, and other processing on a substrate, metal or other conductive materials are often deposited or formed to provide the electrical connections between components. Because this metallization may be performed after many manufacturing operations, problems occurring during the metallization may create expensive waste substrates or wafers.

Electroplating is performed in an electroplating chamber with the device side of the wafer in a bath of liquid electrolyte, and with electrical contacts on a contact ring touching a conductive layer on the wafer surface. Electrical current is passed through the electrolyte and the conductive layer. Metal ions in the electrolyte plate out onto the wafer, creating a metal layer on the wafer. Electroplating operations may include a number of operations with liquid distribution that may cause plating fluid to be lost, diluted, or otherwise affected by the process being performed.

Thus, there is a need for improved systems and methods that can be used to produce high quality devices and structures while protecting both the substrate and the plating baths. These and other needs are addressed by the present technology.

SUMMARY

Electroplating systems according to embodiments of the present technology may include a plating chamber configured to deposit metal material onto substrates positioned in the plating chamber. The plating chamber may include a rotor and a vessel. The electroplating systems may include at least one of baffle positioned in the plating chamber. The at least one baffle may define a plurality of slots. The at least one baffle may be configured to limit or prevent fluid from splashing the rotor or the plating chamber during operation of the plating chamber.

In some embodiments, the at least one baffle may be positioned at the top of the vessel at least partially above a fluid line of the fluid. The at least one baffle may include a mounting tab defining at least one mounting hole. The mounting tab may extend within at least one slot of the plurality of slots. The at least one mounting hole may be sized to receive a mounting screw. The at least one baffle may include a mounting tab defining at least one mounting hole. The mounting tab may be positioned external to the plurality of slots. The at least one mounting hole sized to receive a mounting screw. The at least one baffle may be positioned horizontally adjacent to a weir thief electrode assembly and vertically adjacent to the rotor and a paddle. The paddle may be positioned on the weir thief electrode assembly and configured to move in at least one direction. The at least one baffle may prevent motion of the fluid in at least one direction by obstructing fluid movement using the plurality of slots. A height of the at least one baffle may be greater than or about 15% of a length of the at least one baffle. A mesh may be positioned in each slot of the plurality of slots.

Some embodiments of the present technology may encompass baffles configured to prevent fluid from splashing a rotor or a plating chamber during operation of the plating chamber. The baffles may include a plurality of slots. The baffles may include at least one mounting tab for attaching the baffle to the plating chamber. In some embodiments, the baffle may be at least one baffle. The at least one baffle may be positioned at the top of a vessel at least partially above a fluid line of the fluid. The vessel may be included in the plating chamber. Each slot of the plurality of slots may be characterized by a width of less than or about 25% of a length of the at least one baffle. The mounting tab may define at least one mounting hole. The mounting tab may extend within at least one slot of the plurality of slots. The at least one mounting hole may be sized to receive a mounting screw. The mounting tab may define at least one mounting hole. The mounting tab may be positioned external to the plurality of slots. The at least one mounting hole may be sized to receive a mounting screw. A height of the at least one baffle may be greater than or about 15% of a length of the at least one baffle. The mounting tab may be a flange positioned on the baffle for coupling the baffle to the plating chamber. A mesh may be positioned in each slot of the plurality of slots.

Some embodiments of the present technology may encompass electroplating systems. The systems may include a vessel assembly for holding an electrolyte. The systems may include a weir thief electrode assembly in the vessel assembly. The weir thief electrode assembly may include a plenum inside of a weir frame. The systems may include a plurality of spaced apart openings through the weir frame into the plenum. The systems may include a weir ring attached to the weir frame. The systems may include at least one baffle disposed in the vessel assembly. The at least one baffle may define a plurality of slots. The at least one baffle may be configured to prevent fluid from splashing a rotor or a plating chamber during operation of the electroplating system.

In some embodiments, the at least one baffle may be positioned at the top of the vessel assembly at least partially above a fluid line of the electrolyte. The at least one baffle may include a mounting tab defining at least one mounting hole. The mounting tab may extend within at least one slot of the plurality of slots. The at least one mounting hole may be configured to facilitate attachment of the at least one baffle to the weir thief electrode assembly. The at least one baffle may include a mounting tab defining at least one mounting hole. The mounting tab may be positioned external to the plurality of slots. The at least one mounting hole may be sized to receive a mounting screw. A height of the at least one baffle may be greater than or about 15% of a length of the at least one baffle. A mesh may be positioned in each slot of the plurality of slots.

Such technology may provide numerous benefits over conventional systems and techniques. For example, embodiments of the present technology may mitigate or eliminate splashing of plating fluid within the plating chamber. This may reduce down time for cleaning, and may help maintain additive levels in the fluid. These and other embodiments, along with their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

FIG. 6 is a schematic partial top view of a vessel of an electroplating chamber according to some embodiments of the present technology.

Figure 1:
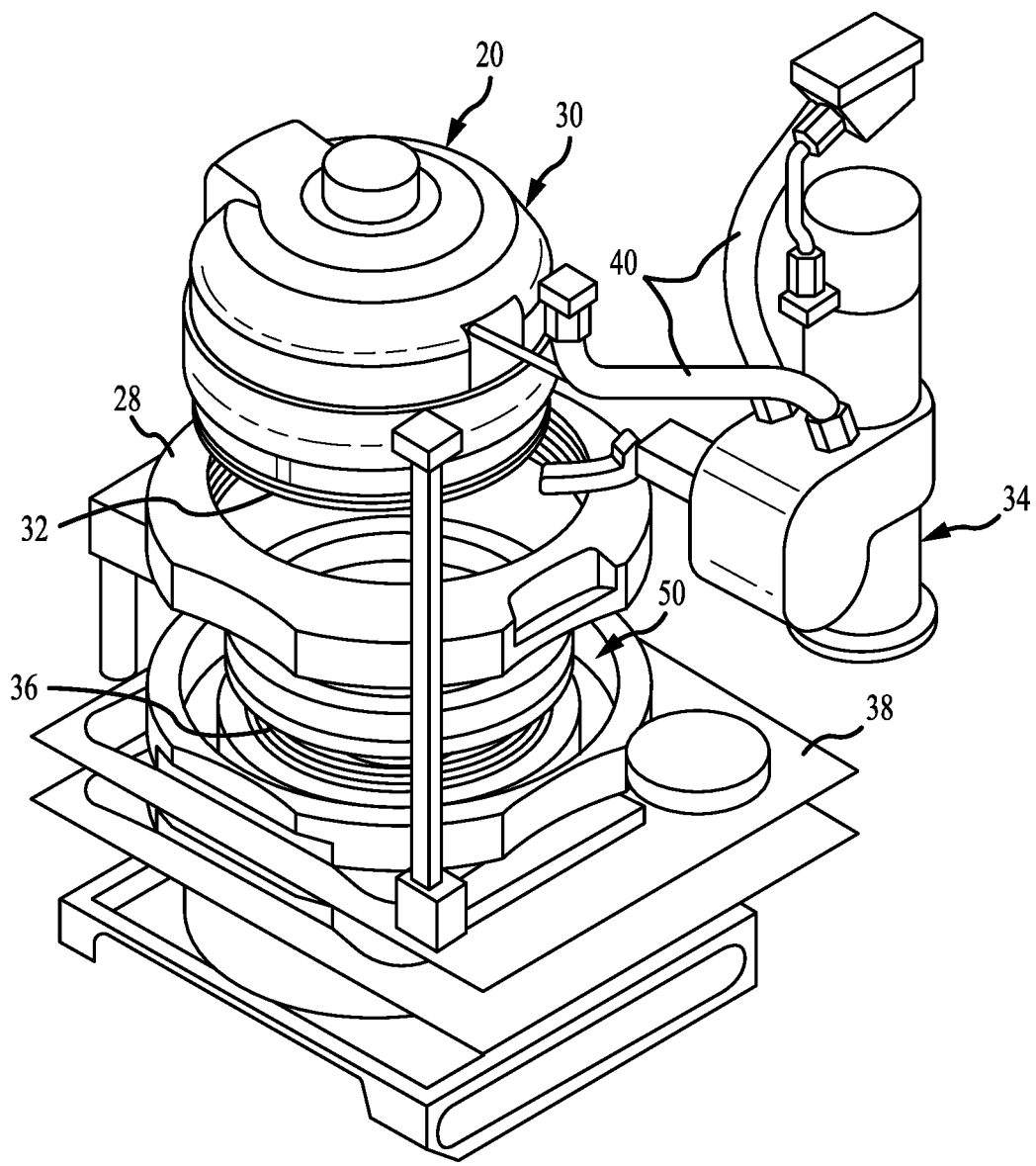
FIG. 1 is a schematic perspective view of an electroplating system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Microelectronic devices, such as semiconductor devices, can be fabricated on or in wafers or work pieces. A typical wafer plating process may involve depositing a metal seed layer onto a surface of the wafer via vapor deposition. A photoresist may be deposited and patterned to expose the seed layer. The wafer may then be moved into a vessel or head of an electroplating system in which electric current may be conducted through an electrolyte to the wafer for applying a blanket layer or patterned layer of a metal material or other conductive material onto the seed layer. Examples of conductive materials may include gold, silver, copper, cobalt, tin, nickel, and alloys of these metals, etc. Subsequent processing steps may form components, contacts, conductive lines on the wafer, or a combination thereof.

In some applications, it may be important that the plated film or layers of metal have a uniform thickness across the wafer or the work piece. Some electroplating systems use a current thief, which is an electrode having the same polarity as the wafer. The current thief may be positioned on or in a weir thief electrode assembly and may operate by drawing current away from an edge of the wafer. This may help to keep the plating thickness at the edge of the wafer more uniform with a plating thickness over other portions of the wafer. The current thief may be a physical electrode close to the edge of the wafer. Alternatively the current thief may be a virtual current thief, where the physical electrode is remote from the wafer. In this design, current from the remote physical electrode is conducted through electrolyte to positions near the wafer. Electroplating processes in wafer level packaging and other applications are diverse with variations in process and wafer patterns. Significant plating non-uniformities often occur along the edge of the wafer pattern. Non-uniformities can be caused by irregularities in the electric field due to pattern variations or by mass-transfer non-uniformities near the wafer edge.

Some electroplating processors can use a paddle or an agitator to agitate the electrolyte, or fluid in the electroplating system, and increase mass transfer of metal ions in the electrolyte onto the wafer, which can also improve plating uniformity. However, the agitation of the electrolyte, or the fluid, may lead to splashing on portions of the electroplating system such as a rotor or a chamber of the electroplating system. Oscillatory motion of the paddle can produce waves or wave-like motion of the fluid that can create the splashing as waves flowing in opposite directions contact. This splashing may yield undesirable effects including additional cleaning operations as well as contact of acid on a number of chamber components, which may cause damage over time. To correct or otherwise prevent these challenges, the present technology may include one or more baffles in the electroplating system. The baffles may prevent splashing of the fluid by obstructing movement of the electrolyte or fluid.

Although the remaining disclosure will routinely identify specific plating processes utilizing the disclosed technology, it will be readily understood that the systems and methods are equally applicable to other metals and chamber configurations. Accordingly, the technology should not be considered to be so limited as for use with these specific plating processes or chambers alone. The technology will discuss one possible system and chamber that may include components according to embodiments of the present technology before additional variations and adjustments to this system according to embodiments of the present technology are described.

FIG. 1 is a schematic view of an electroplating system 20, according to some embodiments of the present technology. The electroplating system 20 as illustrated, may include a head 30 that may be positioned above a vessel assembly 36, which may be a chamber as discussed further below. The electroplating system 20 may be a standalone unit, although the electroplating system 20 may be one of a set of plating systems provided in arrays within an enclosure, with wafers or work pieces loaded and unloaded into and out of processors by one or more robots. The head 30 may be supported on a lift or a lift/rotate unit 34. The lift/rotate unit 34 may be configured to lift the head 30, invert the head 30, or both, to load and unload a wafer into a rotor 32 within the head 30, and may be configured for lowering the head 30 into engagement with the vessel assembly 36 for processing. The rotor 32 may include a contact ring that may make electrical contact with a wafer held in the rotor 32 during processing. Electrical control and power cables 40 may be communicatively coupled with the lift/rotate unit 34 and to internal head components leading up from system to facility connections, or to connections within a multi-processor automated system. A rinse assembly 28 may have tiered drain rings may be provided above a vessel frame 50.

Figure 2:
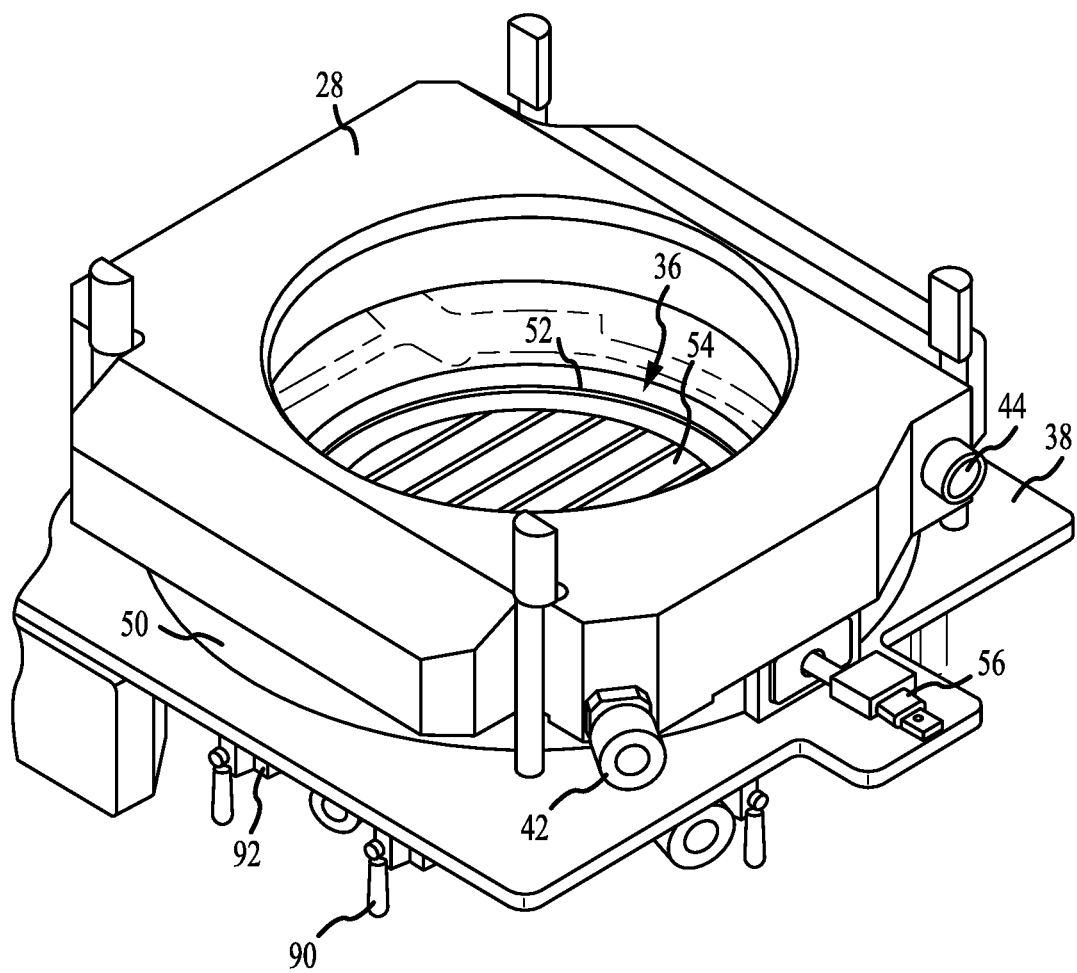
FIG. 2 is a schematic perspective view of a vessel assembly of an electroplating chamber according to some embodiments of the present technology.

FIG. 2 is a schematic view of vessel assembly 36, of an electroplating chamber, according to some embodiments of the present technology. A weir thief electrode assembly 52 may be positioned near the top of the vessel frame 50 or vessel, and a paddle 54 may be positioned in the vessel assembly 36 below a level of the segmented weir thief electrode assembly 52. The paddle 54 can be moved by a paddle actuator 56 that may be positioned on a vessel mounting plate 38. Within the rinse assembly, a set of drain rings may be included, and may be connected to drain and vacuum facilities via one or more drain fittings 42 and aspiration fittings 44. Multiple latches 90, which may be on a lower cup of an anode assembly, or on the base plate, may engage with latch rings 92 on the vessel frame 50 or on the vessel mounting plate 38, which may allow quick installation and removal of an anode assembly.

The paddle 54 may be configured to oscillate back-and-forth laterally to facilitate deposition of a metal product on a substrate positioned in the electroplating system 20. The oscillatory motion of the paddle 54 may cause fluid contained in the vessel assembly 36 to form waves or incur wave-like motion. However, this motion may cause waves to contact, which may cause an upward delivery of plating fluid that may splash fluid on components of the electroplating system 20 such as the rotor 32 or the head 30. By incorporating baffles according to embodiments of the present technology in locations where splashing may occur, the baffles may limit or prevent fluid loss from the chamber.

Figure 3:
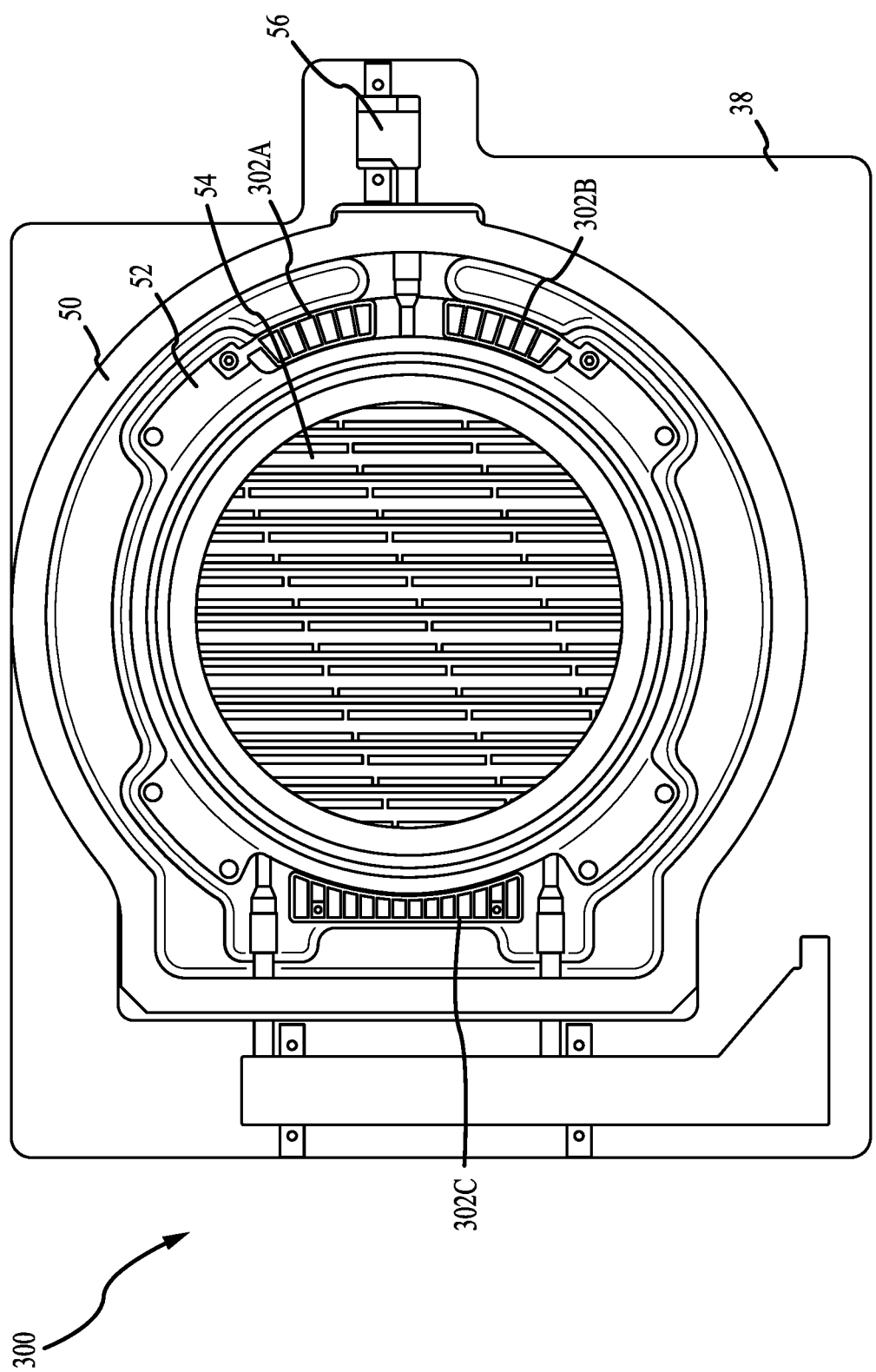
FIG. 3 is a schematic top view of an electroplating chamber according to some embodiments of the present technology.

FIG. 3 is a schematic partial top view of an electroplating chamber 300 according to some embodiments of the present technology, such as with the rotor and head removed. The chamber 300 may be similar to the vessel assembly 36 of FIG. 1 or FIG. 2, and may include any component, feature, or characteristic as discussed above, and may illustrate additional features of electroplating systems according to embodiments of the present technology. As illustrated, the chamber may include a mounting plate 38, within which a vessel 50 may be seated. As previously described, a head, having a rotor, may extend within the vessel to perform electroplating operations.

Coupled with the vessel may be a weir thief electrode assembly 52, which may include a number of lugs that may be spaced about the assembly to be connected with the vessel frame. A paddle 54 may be disposed within the vessel, and operated with a paddle actuator 56 that may move the paddle back and forth to cause oscillations within the plating fluid during plating operations. As illustrated, the coupling of the weir thief electrode assembly 52 with the vessel frame 50 may at least partially form sealed regions about the vessel, which may maintain the plating fluid within the plating chamber. However, at regions about the two ends of the paddle actuator, the vessel may be exposed radially outward of the weir thief electrode assembly as illustrated. During actuation, plating fluid flowing in waves from the oscillation of the paddle may cause interact with other waves. This may cause upward projections of the fluid that may flow out of the vessel and splash onto any number of components, including the rotor positioned within the vessel, the vessel, the paddle actuator, and other aspects of the vessel assembly.

Accordingly, in some embodiments of the present technology, one or more baffles 302 may be incorporated within the vessel frame at locations radially outward of the weir thief electrode assembly, and which may be over exposed accesses of the vessel. Chamber 300 includes three baffles 302A, 302B, and 302C, as illustrated, although it is to be understood that any number of baffles may be incorporated in systems according to embodiments of the present technology. The baffles 302, as illustrated, may not be symmetric, and may include multiple geometries or configurations, which may accommodate different aspects of the vessel assembly. For example, paddle actuator 56 may include a single coupling located at a first location about the vessel assembly, while including multiple couplings located at a second location about the vessel assembly, such as a second location opposite the first location. Although one and two connection locations are illustrated, it is to be understood that any number of connections may be encompassed by embodiments of the present technology. As illustrated, gaps at the vessel assembly may then be between connections at the second location, where the connections extend to the paddle proximate lugs of the weir thief electrode assembly. Additionally, gaps at the vessel assembly may also be on either side of the connection at the first location. In some embodiments, baffles 302 may be included to accommodate each of these configurations.

At the first location, a baffle 302 may be positioned on either side of the actuator coupling, such as baffles 302A and 302B, while a baffle 302C may be positioned between the two actuator couplings at the second location. Baffles 302A and 302B may each be coupled with the weir thief electrode assembly, such as coupled at a lug location. Apertures through a lug of the baffle may accommodate the lug connectors to couple with the vessel frame indirectly. Baffle 302C may directly couple with the vessel frame between the two actuator couplings. In operation, chamber 300 may include fluid that facilitates processing in the electroplating system. The paddle 54 may oscillate back-and-forth in the fluid, creating waves or wave-like motion in the fluid, which may splash out of the chamber in conventional systems. However, baffles 302 may obstruct the waves or wave-like motion of the fluid, thereby preventing the fluid from splashing out of the vessel. The baffles 302 may be positioned radially adjacent to the weir thief electrode assembly 52 and vertically adjacent to the rotor 32 and the head 30, and the baffles 302 may be vertically positioned in which a level of fluid is at or below a level of the baffles 302.

Figure 4A:
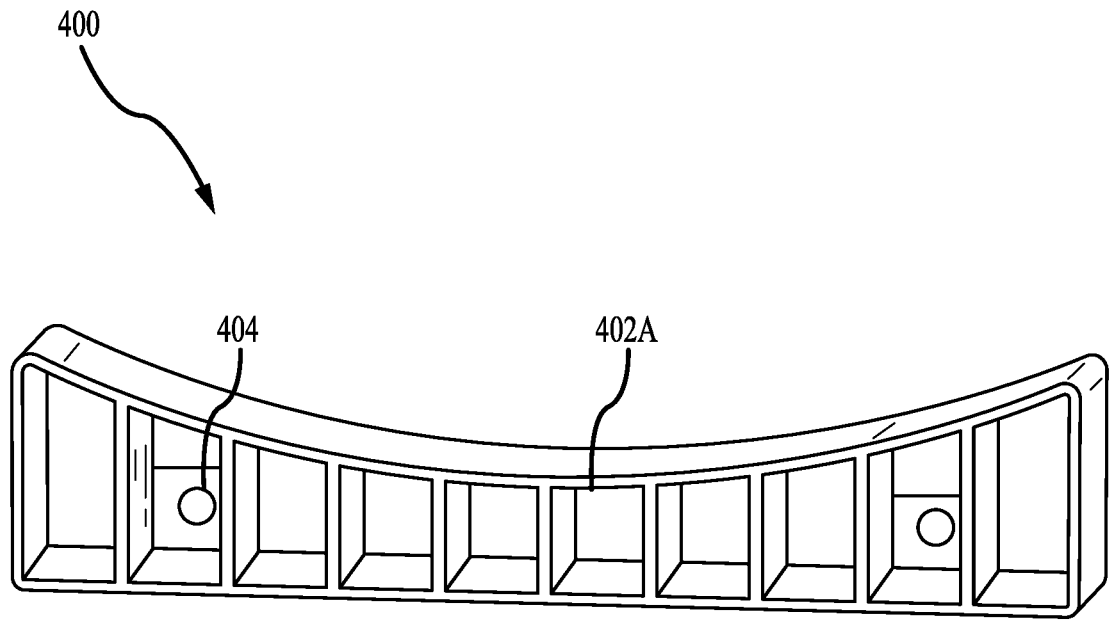
FIGS. 4A-4B are schematic perspective views of baffles according to some embodiments of the present technology.
Figure 4B:
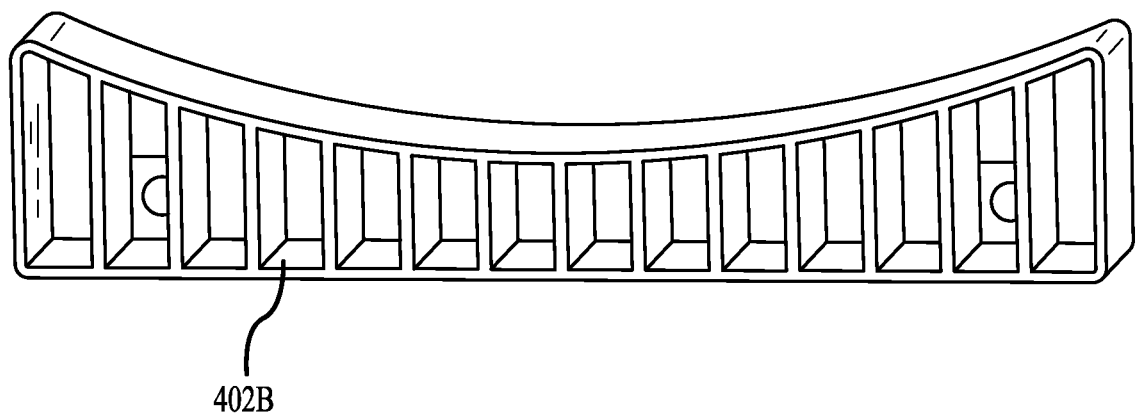

FIGS. 4A-4B show schematic perspective views of baffles 400 according to some embodiments of the present technology, and may show detailed views of baffles 302C as discussed above. As illustrated, the baffles 400 may illustrate baffles having differing numbers of slots 402 formed within the baffles. By including additional slots, a further break may be provided for electroplating fluid, although it is to be understood that any number of slots may be formed to produce barriers to fluid flow above a level of the baffles. The baffles 400 may be configured to prevent splashing in the vessel of the electroplating system by obstructing motion of fluid in the vessel during a processing operation of the electroplating system. The baffles may be positioned in the vessel at the same level of the fluid in the vessel, or at least slightly above or below an established static or variable level of the plating fluid, such as during operation.

The baffles 400 may define a set of slots 402, as illustrated, which may be disposed at any distance along the baffle. For example, slots may be formed at distances of less than or about 5 cm, less than or about 4 cm, less than or about 3 cm, less than or about 2 cm, less than or about 2 cm, or less along the length of the baffle. As shown in FIG. 4A, the baffle includes ten slots 402A, and the baffle in FIG. 4B includes 14 slots 402B, although the baffles may be of the same or similar overall size. The slots may be maintained open as illustrated, although in some examples a mesh may be included in the set of slots for further reducing or eliminating splashing in the electroplating system. The baffles may be characterized by a height of greater than or approximately 10% of the length of the baffles, and may be characterized by a height of greater than or about 15% of the length of the baffles, greater than or about 20% of the length, or greater. The baffles may be constructed of any suitable material for use in the electroplating system, which may include a polymeric or other material that may be insulative and may be inert within the plating bath. For example, in some embodiments the baffles may be or include polytetrafluoroethylene, polyether ether ketone, or other ceramic or polymer materials that may be stable within a plating bath.

The baffles 400, as illustrated in FIG. 4, may include one or more mounting tabs 404 positioned within the slots. The mounting tabs 404 may be sized to receive a mounting screw, tab, bolt, or other coupling items for attaching the baffles to the vessel of the electroplating system. Additionally, the mounting tabs 404 may press fit or connect with a slot formed in the vessel frame, or any other connection mechanism for coupling the component. As illustrated, while a first longitudinal edge may be relatively straight, an opposite edge may be characterized by an arcuate profile to accommodate the rounded profile of the weir thief electrode assembly within the system.

Figure 5A:
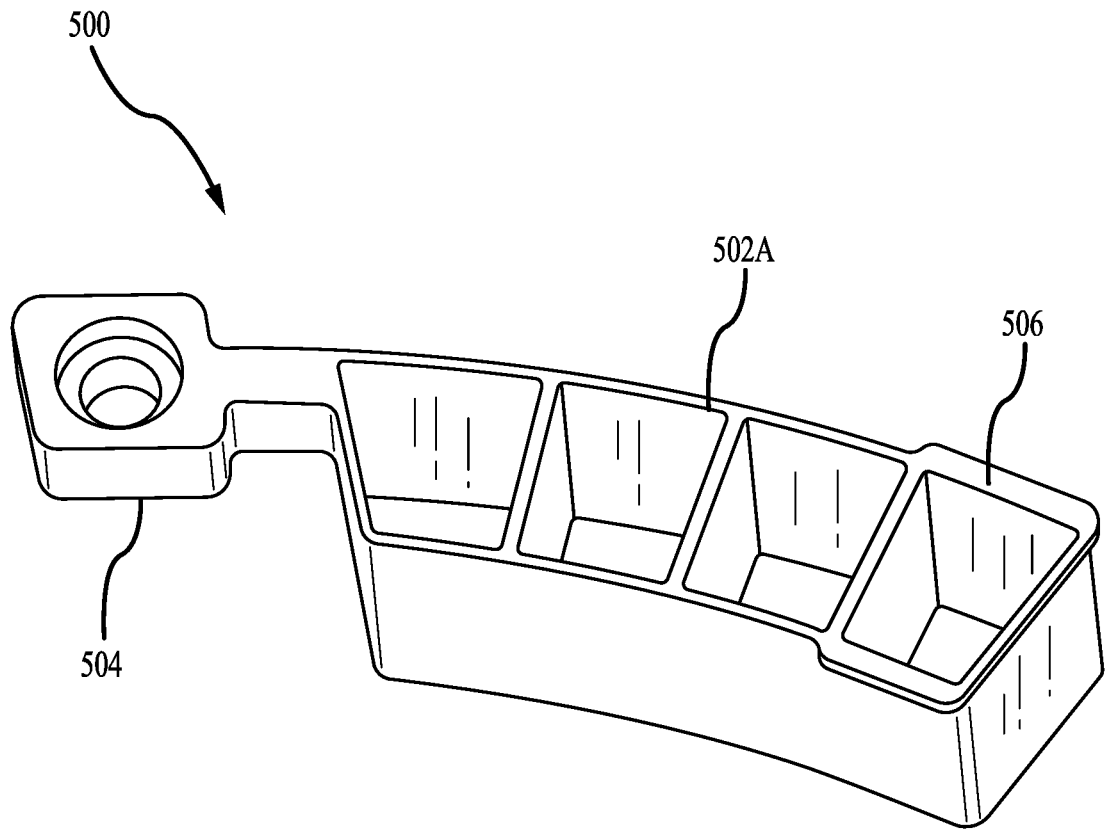
FIGS. 5A-5B are schematic perspective views of baffles according to some embodiments of the present technology.
Figure 5B:
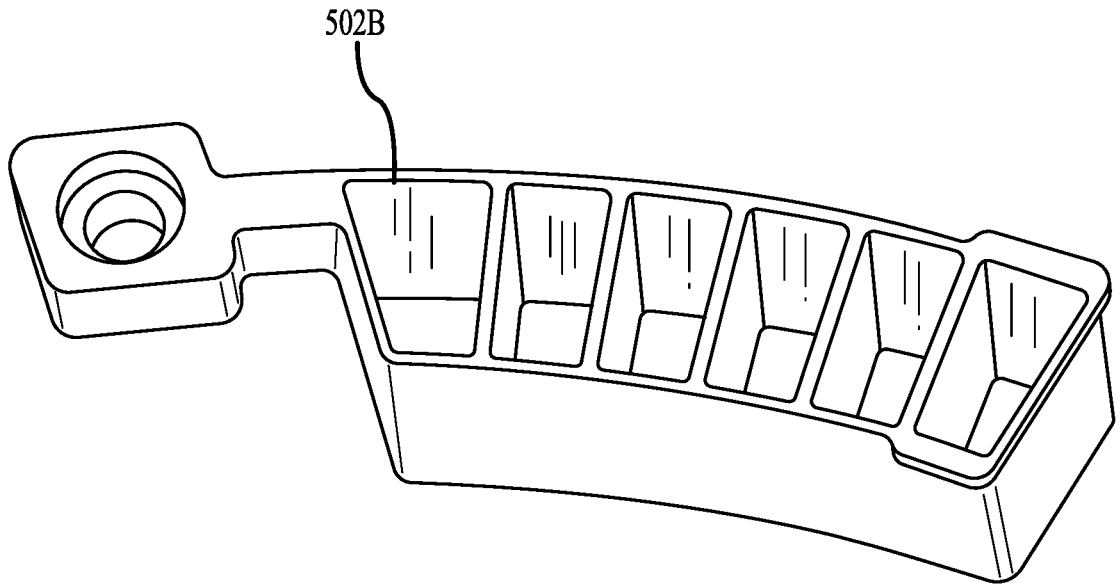

FIGS. 5A-5B are schematic perspective views of baffles 500 according to some embodiments of the present technology, and may show detailed views of baffles, such as baffles 302A and 302B as discussed above. Baffles 500 may include any feature or characteristics of any baffle previously described. As illustrated, the baffles again may illustrate baffles having differing numbers of slots 502 formed within the baffles. For example, the baffles may be characterized by a shape to accommodate a profile of the vessel radially outward of the weir thief electrode assembly as previously described. The baffles may include any number of slots, such as fewer slots 502A, or more slots 502B. The slots may be maintained open as illustrated, although in some examples a mesh may be included in the set of slots for further reducing or eliminating splashing in the electroplating system. Additionally, the baffles 500 may include a mounting tab 504 positioned laterally outward from the slots as illustrated, and may define an aperture for receiving a bolt or other coupling mechanism to seat the baffle against a weir thief electrode assembly lug as previously described. Unlike baffles 400, baffles 500 may be positioned on opposite sides of an actuator coupling as discussed above. Accordingly, the baffles may be limited to a single location for coupling, which may be on a lug for the weir thief electrode assembly. Accordingly, in some embodiments, baffles 500 may define a rim or flange 506 extending from exterior walls of the baffle, which may allow the end of the baffle opposite the mounting tab to be seated against the vessel assembly, which may limit or prevent movement during operation. For example, flange 506 may extend from a radially inner wall and a radially outer wall of the baffle, and may extend along any length of the baffle as illustrated.

FIG. 6 is a schematic partial top view of a vessel of an electroplating chamber 600 according to some embodiments of the present technology. As illustrated, the baffle 400 may be installed on the vessel of electroplating chamber 300. The baffle 400 may be attached to the vessel via at least one mounting tab 602 having at least one mounting screw, bolt, or other fastener. In some embodiments, the at least one mounting tab 602 may be configured to attach or otherwise install the baffle 400 to the vessel of the electroplating system. The baffle 400 may be installed within the vessel as illustrated, such as seated against a back wall, at a level above, below, or about in line with a fluid level for plating fluid, when contained in the vessel. In some embodiments, the baffle 400 may additionally be positioned radially outward of and adjacent to the weir thief electrode assembly 52 and vertically adjacent to both the rotor and the paddle of the electroplating system when in operational position. For example, the baffle 400 may be positioned above than the paddle, while positioned below a location of the rotor.

Figure 7:
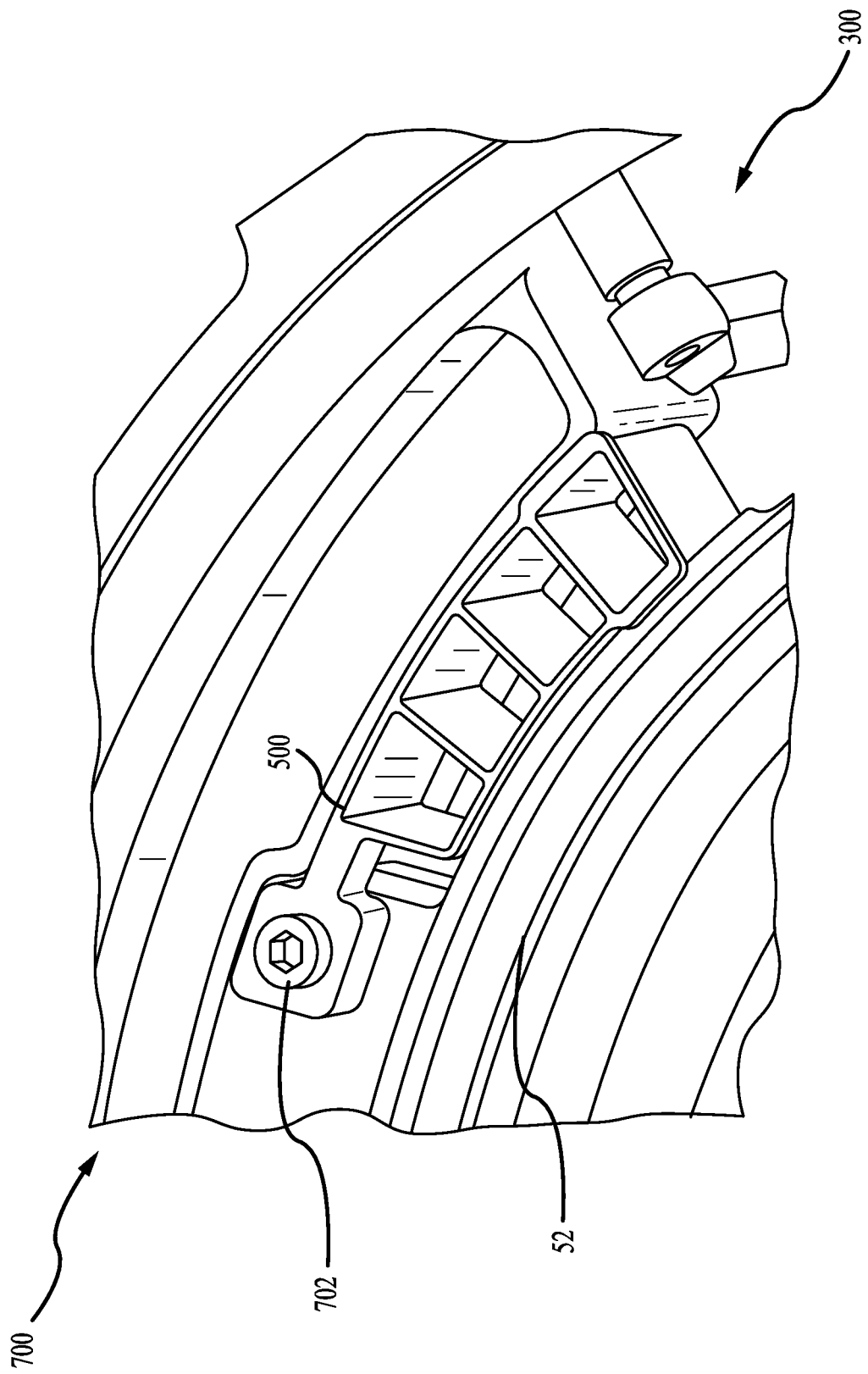
FIG. 7 is a schematic partial perspective view of a vessel of an electroplating chamber according to some embodiments of the present technology.

FIG. 7 is a schematic partial perspective view of a vessel of an electroplating chamber 700 according to some embodiments of the present technology. As illustrated, the baffle 500 may be installed on the vessel of electroplating chamber 300. The baffle 500 may be attached to the vessel via at least one mounting tab 702, which may receive a bolt used with a lug of the weir thief electrode assembly 52, using at least one mounting screw, bolt, or other fastener. The baffle 500 may be installed within the vessel as illustrated, such as seated between the weir thief electrode assembly 52, and a drain defined within the vessel frame. Additionally, the baffle 500 may be positioned at a level above, below, or about in line with a fluid level for plating fluid, when contained in the vessel. In some embodiments, the baffle 500 may additionally be positioned radially outward of and adjacent to the weir thief electrode assembly 52 and vertically adjacent to both the rotor and the paddle of the electroplating system when in operational position.

For example, the baffle 400 may be positioned above than the paddle, while positioned below a location of the rotor. Additionally, the flange of the baffle as described above, may allow the baffle to seat on a rim of the weir thief electrode assembly 52 along a radially inner wall of the baffle. Additionally, the flange may allow the baffle to also seat on a rim of the vessel frame along a radially outer wall of the baffle. This may allow the baffle to be substantially maintained in place during operation, where the system may have a gap on an opposite end of the baffle from the mounting tab, which may otherwise limit mounting options within the system.

Figure 8:
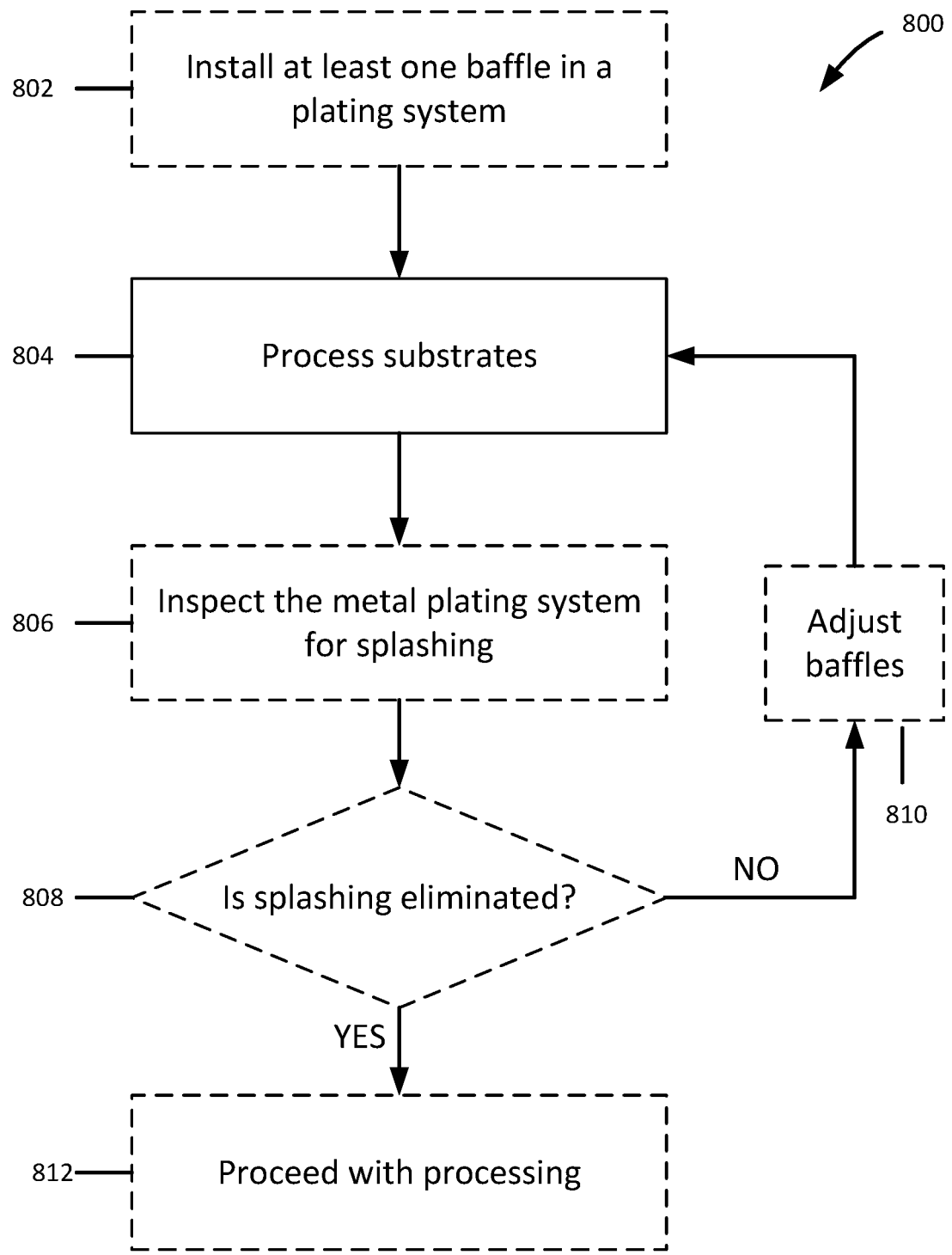
FIG. 8 shows operations of an exemplary method of semiconductor processing according to some embodiments of the present technology.

FIG. 8 shows a flow chart for a process 800 of semiconductor processing according to some embodiments of the present technology, and may illustrate methods of operation for plating systems including baffles as previously described. The process may be performed in a variety of processing chambers, including any of the chambers previously described, and which may include components according to embodiments of the present technology, such as any baffle, or other component discussed previously. The process 800 may include a number of optional operations, which may or may not be specifically associated with some embodiments of methods according to the present technology.

The electroplating chamber may be any of the chambers previously described, and may include any number of baffles, including any baffle configuration as previously described. At optional operation 802, the process 800 may include installing at least one baffle in the electroplating system. As described previously, during operation, a paddle of the electroplating system may oscillate back and forth in a vessel of the electroplating chamber in two or more directions while a deposition process is being performed. To reduce or eliminate the splashing, at least one baffle can be installed in gaps about the system, which may form barriers against wave activity as the waves or eddies extend upward into the slots of the baffles.

A substrate may be chucked to a head or rotor of the electroplating system, and a processing operation may be performed at operation 804. The processing may include a plating operation, where a metal, such as any metal previously described may be plated onto the substrate, which may include any number of features. A paddle may be actuated by a paddle actuator in a back-and-forth motion to form currents or waves within a plating fluid disposed within the vessel, which may improve plating operations as previously described. Waves or currents may be formed at a surface of the plating fluid, which may create vertical motion. When these waves contact additional waves, the fluid may flow upward at gaps within the system, which if open may otherwise allow splashing. However, with baffles installed within the system, the waves may extend up into slots formed in the baffles, which may form barriers to wave formation. This may break the formation of waves, which limit or prevent splashing within the system.

Although in some embodiments the method may be completed if wave formation or splashing is sufficiently limited or prevented, in some embodiments adjustments may be made to the baffles. For example, at optional operation 806, the process may include inspecting the electroplating system for splashing, and determining at optional operation 808 whether splashing has been sufficiently eliminated. If plating fluid has been directed onto the rotor, or any other chamber component, the method may include adjusting the baffles at optional operation 810. For example, the adjustment may include adding baffles, or raising or lowering the baffles in relation to a plating fluid to better contact the fluid or better interact with moving fluid within the vessel.

This process may then be repeated for any number of substrates until fluid control has been achieved. Once splashing or fluid loss has been reduced sufficiently or eliminated at optional operation 812 production may be continued, and any number of substrates may be processed. By utilizing baffles according to any embodiments of the present technology, improved control of fluid flow within an electroplating chamber may be achieved. The baffles may accommodate any number of chamber configurations, and may be sized or shaped to accommodate any number of gaps within a system where plating fluid may otherwise flow from the vessel.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the baffle" includes reference to one or more baffles and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. An electroplating system comprising:
a plating chamber configured to deposit metal material onto substrates positioned in the plating chamber, the plating chamber comprising a rotor and a vessel;
a weir thief electrode disposed in the vessel; and
at least one of baffle positioned in the plating chamber, the at least one baffle defining a plurality of slots, the at least one baffle configured to prevent fluid from splashing the rotor or the plating chamber during operation of the plating chamber, wherein each slot of the at least one baffle is disposed radially outward of the weir thief electrode, wherein each slot of the at least one baffle extends vertically through at least a thickness of a respective baffle.

2. The electroplating system of claim 1, wherein the at least one baffle is positioned at a top of the vessel at least partially above a fluid line of the fluid.

3. The electroplating system of claim 1, wherein the at least one baffle further comprises a mounting tab defining at least one mounting hole, wherein the mounting tab extends within at least one slot of the plurality of slots, the at least one mounting hole sized to receive a mounting screw.

4. The electroplating system of claim 1, wherein the at least one baffle further comprises a mounting tab defining at least one mounting hole, wherein the mounting tab is positioned external to the plurality of slots, the at least one mounting hole sized to receive a mounting screw.

5. The electroplating system of claim 1, wherein the at least one baffle is positioned horizontally adjacent to a weir thief electrode assembly and vertically adjacent to the rotor and a paddle, the paddle positioned on the weir thief electrode assembly and configured to move in at least one direction, and wherein the at least one baffle prevents motion of the fluid in at least one direction by obstructing fluid movement using the plurality of slots.

6. The electroplating system of claim 1, wherein a height of the at least one baffle is greater than or about 15% of a length of the at least one baffle.

7. The electroplating system of claim 1, wherein a mesh is positioned in each slot of the plurality of slots.

8. An electroplating system comprising:
a vessel assembly for holding an electrolyte;
a weir thief electrode disposed in the vessel assembly; and
at least one baffle disposed in the vessel assembly, the at least one baffle defining a plurality of slots, the at least one baffle configured to prevent fluid from splashing a rotor or a plating chamber during operation of the electroplating system, wherein each slot of the at least one baffle is disposed radially outward of the weir thief electrode, and wherein each slot of the at least one baffle extends vertically through at least a thickness of a respective baffle.

9. The electroplating system of claim 8, wherein the at least one baffle is positioned at a top of the vessel assembly at least partially above a fluid line of the electrolyte.

10. The electroplating system of claim 8, wherein the at least one baffle further comprises a mounting tab defining at least one mounting hole, wherein the mounting tab extends within at least one slot of the plurality of slots, the at least one mounting hole configured to facilitate attachment of the at least one baffle to the weir thief electrode.

11. The electroplating system of claim 8, wherein the at least one baffle further comprises a mounting tab defining at least one mounting hole, wherein the mounting tab is positioned external to the plurality of slots, the at least one mounting hole sized to receive a mounting screw.

12. The electroplating system of claim 8, wherein a height of the at least one baffle is greater than or about 15% of a length of the at least one baffle.

13. The electroplating system of claim 8, wherein a mesh is positioned in each slot of the plurality of slots.

14. The electroplating system of claim 8, wherein the at least one baffle further comprises a mounting tab defining at least one mounting hole, wherein the mounting tab extends within at least one slot of the plurality of slots, the at least one mounting hole sized to receive a mounting screw.

15. The electroplating system of claim 11, wherein the mounting tab is a flange positioned on the at least one baffle for coupling the at least one baffle to the plating chamber.

16. The electroplating system of claim 8, wherein adjacent slots of the plurality of slots are separated by a dividing member that extends along the thickness of the respective baffle.

17. The electroplating system of claim 8, wherein each slot of the plurality of slots is characterized by a width of less than or about 25% of a length of the at least one baffle.

* * * * *